United States Patent [19]

Iwashima

[11] Patent Number: 4,977,317
[45] Date of Patent: Dec. 11, 1990

[54] RESIN-MOLDED TYPE PHOTOSENSOR

[75] Inventor: Osamu Iwashima, Tokyo, Japan

[73] Assignee: NEC Corporation, Japan

[21] Appl. No.: 428,130

[22] Filed: Oct. 27, 1989

[30] Foreign Application Priority Data

Oct. 27, 1988 [JP]   Japan .................................. 63-272230

[51] Int. Cl.⁵ .............................................. G02B 27/00
[52] U.S. Cl. ...................................... 250/239; 250/551
[58] Field of Search .................... 250/239, 551; 357/19

[56] References Cited

U.S. PATENT DOCUMENTS 4,833,318  5/1989  Yonekura et al. ................... 250/551

Primary Examiner—Edward P. Westin
Attorney, Agent, or Firm—Laff, Whitesel, Conte & Saret

[57] ABSTRACT

A resin-molded type photosensor such as a photointerrupter or a reflection-type photosensor is formed in a body of U-shape. Within the U-shaped resin package, a light emitting element and a light detecting element are provided to be electrically connected to a first external electrode and a second external electrode, respectively. Furthermore, a U-shaped electric conductive coupling member is provided within the package so as to electrically connect the first external lead, the light emitting element, the light detecting element and the second external lead in series. Moreover, a resistor element is provided within the package so as to be electrically connected to the light detecting element in parallel and thereby enabling the photosensor having only two external leads.

4 Claims, 3 Drawing Sheets

4,977,317

RESIN-MOLDED TYPE PHOTOSENSOR

BACKGROUND OF THE INVENTION

The present invention relates to a resin-molded type photosensor such as photointerruptor or reflection-type photosensor.

As an example of resin-molded photosensors there is disclosed a reflection-type photosensor in U.S. Pat. No. 4,833,318 issued on May 23, 1989. In a conventional photosensor, the number of leads led out of a resin-molded package is a total of four, namely, two leads from a light-emitting part and other two leads from a light-receiving part. More specifically, two leads are respectively connected to an anode and a cathode of a light-emitting diode, as a light-emitting element, and when a phototransistor is used as a light-receiving element, two leads are connected to the collector and the emitter of the phototransistor, respectively. In particular, in a photointerruptor which is used for detecting the number of revolutions of a disk or the position of a moving plate, it frequently happens that the position of the disk or the moving plate and the position of the installed electronic component to which the detected signal is to be transmitted are separated by some distance for the reason of design requirement. In such a case, the conventional photointerruptor has four signal lines that need be laid, which becomes a factor for a price increase of the device due to the material cost for four copper wires, labor cost for their soldering, and the like.

SUMMARY OF THE INVENTION

It is, therefore, the object of the present invention to provide a photosensor with smaller number of leads than the conventional device.

One of the features of the present invention resides in that a first lead connected to one of the electrodes of a light-emitting element pellet and a second lead connected to one of the electrodes of a light-receiving element pellet are led out of the resin-molded package, the other electrode of each of both pellets is connected to an electrically conductive coupling member within the package. Further, within the package, a resistor element is connected between the second lead and the coupling member, so as to be electrically connected in parallel to the light-receiving element.

DETAILED DESCRIPTION OF THE PREFERRED EMBODIMENTS

Figure 1:
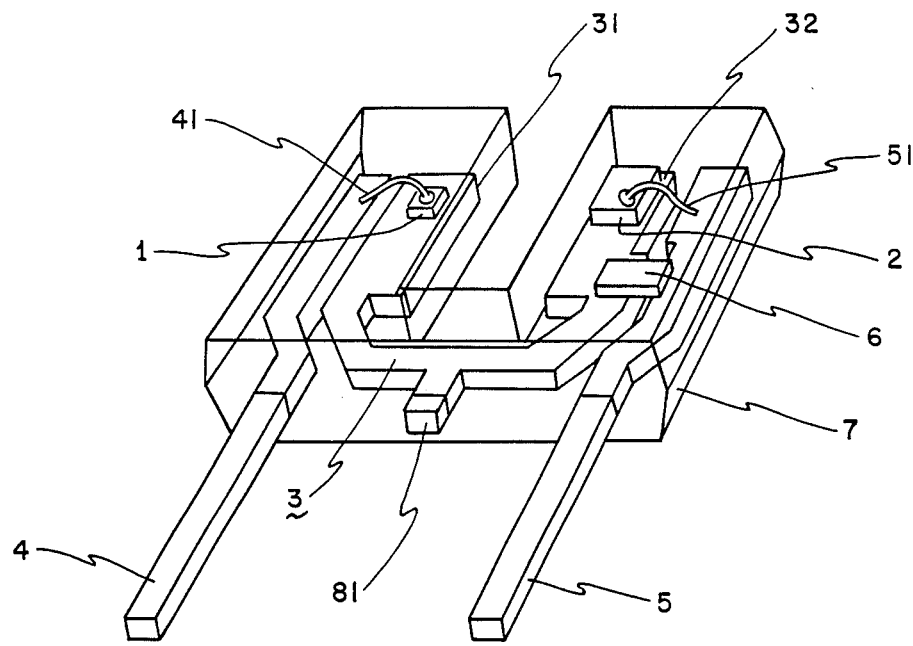
FIG. 1 shows a perspective view of the photointerruptor according to a first embodiment of the present invention.
Figure 2:
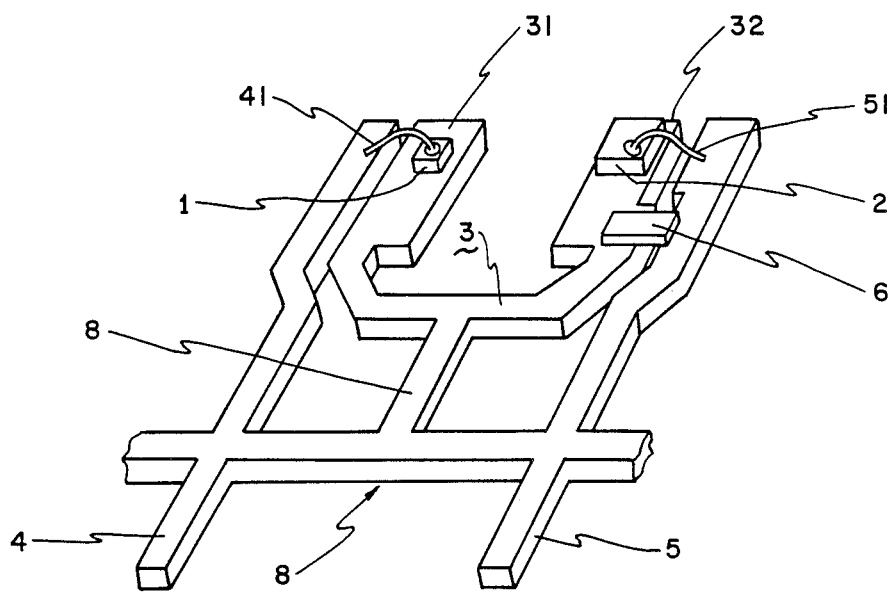
FIG. 2 is a perspective view showing the constitution of the device in FIG. 1 prior to resin-molding process.

The photosensor of the present invention will be described in conjunction with an example of photointerruptor shown in FIG. 1 and FIG. 2.

A light-emitting diode pellet 1 and a phototransistor pellet 2 are respectively mounted on the two end parts 31 and 32 of a U-shaped or horseshoe-shaped coupling member 3. On both outer sides of the coupling member 3 there are respectively arranged a first lead 4 and a second lead 5. These two leads 4 and 5 serve as external electrodes of the photosensor. As shown in FIG. 2, the coupling member 3 and the leads 4 and 5 are held integrally united by means of tie bars 8 until the completion of the resin-molding process. The light-emitting diode pellet 1 and the first lead 4 are electrically connected with a bonding wire 41, and the phototransistor pellet 2 and the second lead 5 are electrically connected with a bonding wire 51. Further, the coupling member 3 and the second lead 5 are connected with a chip resistor 6, electrically connecting in parallel the phototransistor pellet 2 and the chip resistor 6. Each of these components is molded integrally with a resin 7 which is transparent to the radiation emitted by the light-emitting diode pellet 1. The first lead 4 and the second lead 5 are led out of one surface of the molding resin 7 parallel in the same direction as external electrodes. Moreover, a projection 81 is led out of the same surface of the coupling member 3. The projection 81 is a part of the tie bar 8 that integrally held the first lead 4 and the second lead 5, and is the portion which is left when cut off from the tie bar 8 after the completion of the resin-molding process. The molding resin 7 is formed in the shape of the letter U so as to create a gap between the light-emitting diode pellet 1 and the phototransistor pellet 2 in order to form a photointerruptor. The U-shaped resin package 7 may have a pair of lenses to increase the optical coupling efficiency.

Figure 3:
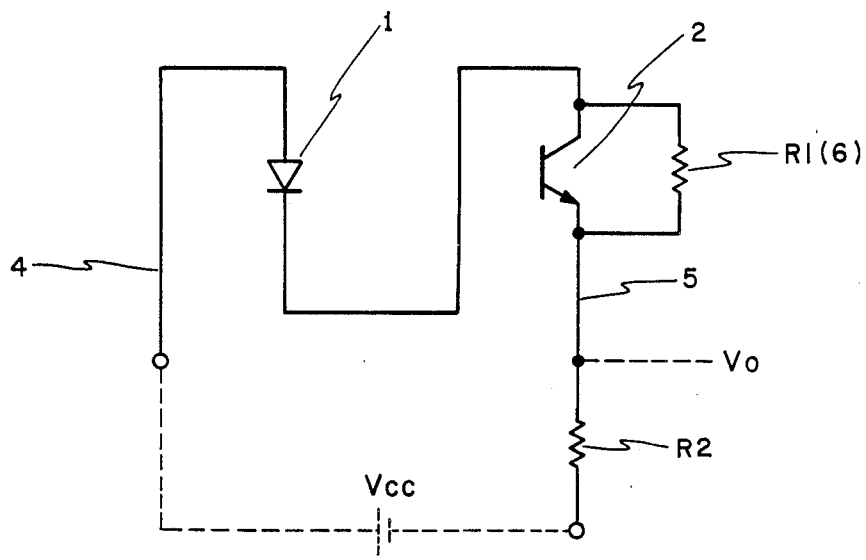
FIG. 3 is an equivalent circuit diagram for the device shown in FIG. 1.

Next, the operation of this embodiment will be described. A resistor $R_1$ shown in FIG. 3 is the chip resistor 6 mentioned above and a resistor $R_2$ is an external resistor for the photointerruptor. In the description that follows it will be assumed that the resistance of the resistors $R_1$ and $R_2$ are both 1 k$\Omega$. The operational function of the system is such that the phototransistor pellet 2 is in the energized state when there is no interceptor between the light-emitting diode pellet 1 and the phototransistor pellet 2, so that the potential difference between the collector and the emitter of the phototransistor pellet, namely, $V_{CE(sat)}$, is about 0.2 V. For convenience, it will be assumed that current will not flow in $R_1$ and all of the current flows through the phototransistor pellet 2. Then, if the source voltage Vcc is 5 V and the forward voltage $V_F$ of the light-emitting diode pellet 1 is 1.5 V, the current that flows in the system is (5 V−1.5 V−0.2 V)/1 k$\Omega$=3.3 mA, so that the voltage $V_0$ in FIG. 3 is 3.3 V. In contrast, if there exists an interceptor, the phototransistor pellet 2 is de-energized and the current flows entirely through the resistor $R_1$. The current that flows in the system at this time is (5 V−1.5 V)/2 k$\Omega$=1.75 mA, and $V_0$ becomes 1.75 V. Since there is generated a distinct difference in the values of $V_0$ for the cases when there is and there is not an interceptor, it becomes possible to detect the presence or absence of an interceptor by monitoring the value for $V_0$. It is to be noted that if there is not included the resistor $R_1$ in the system, current will not flow in the phototransistor pellet 2 when it is de-energized, so that the system cannot function as a photointerruptor. This is the reason why it is necessary to insert the resistor $R_l$ between the collector and the emitter. Accordingly, the present invention makes it possible to realize a necessary and sufficient photointerrupter with two external leads, without spoiling the function of the photointerruptor.

Figure 4:
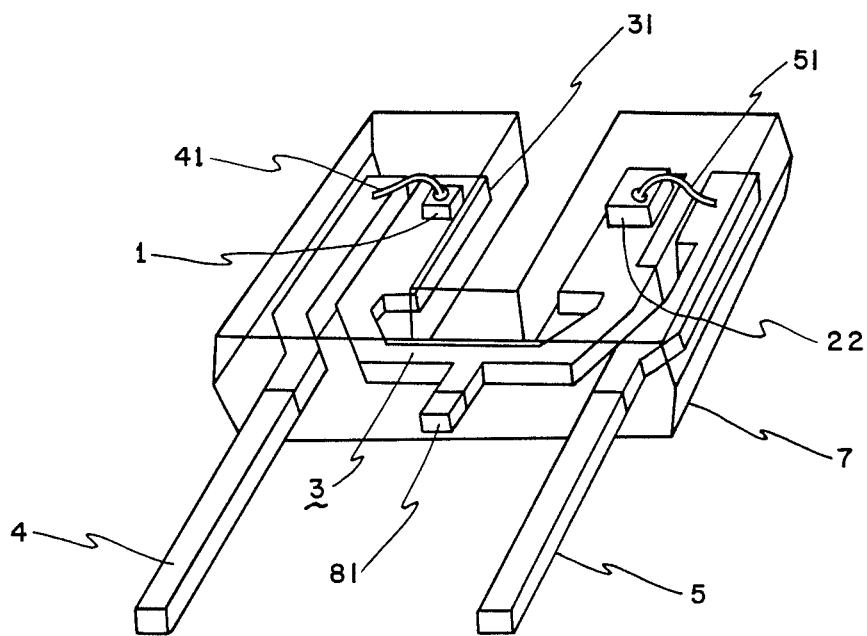
FIG. 4 shows a perspective view of the photointerruptor according to a second embodiment of the present invention.
Figure 5:
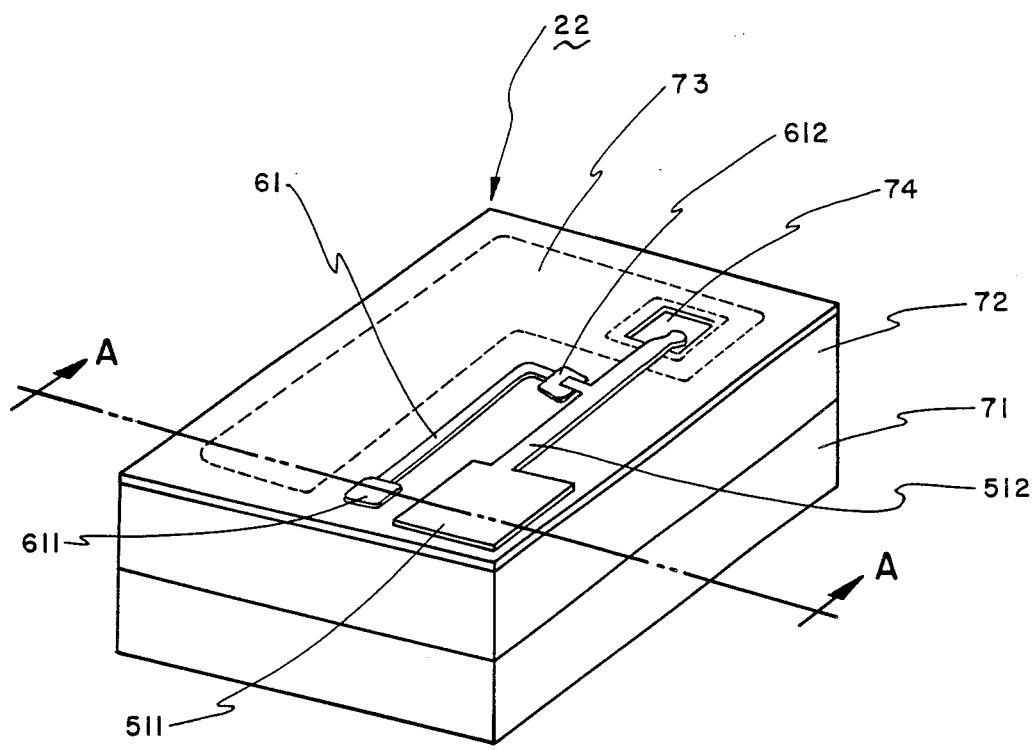
FIG. 5 is a perspective view of a phototransistor pellet with built-in resistor used in the embodiment shown in FIG. 4.
Figure 6:
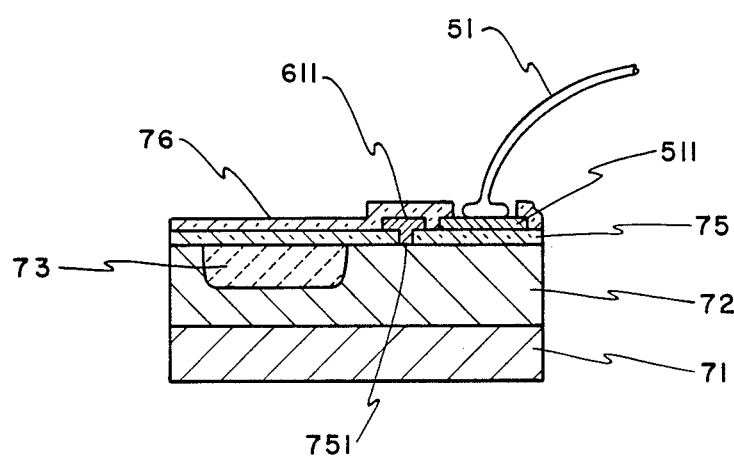
FIG. 6 is a cross-sectional view cut in A—A line shown in FIG. 5.

As the resistor element, a chip resistor was used in the first embodiment, but a light-receiving element and a resistor element are formed integrally in a second embodiment shown in FIG. 4. Namely, as shown in FIG. 5, a polycrystalline silicon resistor film 61 is formed on the phototransistor pellet 22. The phototransistor pellet 22 comprises an n-type silicon substrate 71 and an $n^-$-type silicon epitaxial layer 72 formed thereon as shown in FIG. 6 with a $p^+$-type base region 73. The surface of the pellet 22 is covered by a first passivation film 75 except for an $n^-$-type emitter region 74 and a collector contact region 751. The resistor film 61 is formed on the first passivation film 75 and one end of the resistor film 61 is contacted to the epitaxial layer 72 via a contact pad 611 and the collector contact region 751. Aluminum bonding pad 511 is also provided on the first passivation film 75 and electrically connected to both of the emitter region 74 and the other end of the resistor film 61 at a connecting pad 612 via an aluminum wiring 512. Then a second passivation film 76 is provided on the entire surface of the pellet 22 except for the bonding pad 511. In FIG. 5, the second passivation film 76 is not shown to avoid complexity. Although the size of the light-receiving pellet has to be increased somewhat to accommodate the resistor film 61, there is obtained an advantage that the general assembly can be made simpler and the overall manufacturing cost can be reduced.

As a typical example of the invention, a light emitting diode (LED) of gallium arsenide (GaAs) and emitting infrared rays is used as the light emitting pellet 1, and a phototransistor of silicon (Si) is used as the light detecting pellet 2. Each pellet is mounted on a silver plated iron lead frame with silver paste. The pellets are then subjected to transfer molding after wire bonding by means of gold wire. An infrared ray transmissive, visible light block resin or, for example, a product known as NT8513—9700 (manufactured by Nitto Electric Industrial Co., Ltd.) which uses visible light blocking dyestuff mixed in an epoxy resin, is used as the molding resin.

As has been described in the foregoing, the present invention enables to realize a photosensor with two leads by connecting a light-emitting element and a light-receiving element in series, inserting a resistor element in parallel with the light-receiving element, and molding the system with resin. This brings about an effect that the devices using photosensors such as photointerruptor can be manufactured in a simpler manner.

It should be noted that in the perspective views used in conjunction with the description of the sensors, portions that are covered with the molding resin are also shown with solid lines for convenience instead of broken lines.

What is claimed is:

1. A resin-molded type photosensor comprising:
   a first lead having one end electrically connected to one of the electrodes of a light-emitting element;
   a second lead having one end electrically connected to one of the electrodes of a light-receiving element;
   an electrically conductive coupling member connecting the other end of said light-emitting electrode and the other end of said light-receiving electrode; and
   a resin package for molding said light-emitting element, light-receiving element and electrically conductive coupling member so as to dispose said first lead, second lead and coupling member in the same plane, the other end of each of said first lead and second lead being led out of said resin package.

2. A resin-molded type photosensor as claimed in claim 1, wherein said coupling member having a U-shaped form is disposed between said first lead and second lead, said light-emitting element and light-receiving element are mounted on the respective ends of said coupling member, and said resin envelope has a gap along said U-shaped form.

3. A resin-molded type photosensor as claimed in claim 1, wherein a resistor element is electrically connected between said second lead and said coupling member within said resin package.

4. A resin-molded type photosensor as claimed in claim 1, wherein said light-receiving element is provided with a resistor film such that said resistor film is electrically connected in parallel with a pair of electrodes of said light receiving element.

* * * * *